(12) United States Patent
Roeters et al.

(10) Patent No.: US 6,652,659 B1
(45) Date of Patent: Nov. 25, 2003

(54) LOW SPECIES BUFFERED RINSING FLUIDS AND METHOD

(75) Inventors: Glen Roeters, Huntington Beach, CA (US); Raj Kumar, Mission Viejo, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/452,015

(22) Filed: Nov. 30, 1999

(51) Int. Cl.[7] ................................................. C23G 1/00
(52) U.S. Cl. ............................... 134/2; 134/3; 134/25.1; 134/25.4; 134/34; 134/39; 134/42; 134/902; 438/906; 216/96; 216/97; 216/98; 216/99; 216/103; 216/106; 216/108; 510/175; 510/176
(58) Field of Search ............................... 134/1.3, 2, 29, 134/40, 3, 25.1, 25.4, 34, 39, 42, 902; 216/96, 97, 98, 99, 103, 106, 108; 510/175, 176; 438/906

(56) References Cited

U.S. PATENT DOCUMENTS

| 4,243,700 A | 1/1981 | Piazza ........................ 427/195 |
| 5,145,553 A | 9/1992 | Albrechta et al. ........... 156/640 |
| 5,296,041 A | 3/1994 | Vinci et al. .................... 134/40 |
| 5,312,027 A | 5/1994 | Johns ........................... 228/201 |
| 5,350,457 A | 9/1994 | Kitazawa et al. .............. 134/10 |
| 5,356,527 A | 10/1994 | Chao et al. .................. 205/155 |
| 5,362,330 A | 11/1994 | Preussner et al. ............... 134/1 |
| 5,466,389 A * | 11/1995 | Ilardi et al. ................. 252/156 |
| 5,958,144 A * | 9/1999 | Cala et al. ...................... 134/2 |
| 5,972,123 A * | 10/1999 | Verhaverbeke ................. 134/3 |
| 6,169,323 B1 * | 1/2001 | Sakamoto .................... 257/667 |
| 6,203,691 B1 * | 3/2001 | Hoffman et al. ............. 205/705 |

OTHER PUBLICATIONS

Werner Kern. Handbook of Semiconductor Wafer Cleaning Technology. !993. Noyes Publications. pp. 13 and 529.*
Holtzclaw et al.General Chemistry with Qualitative Analysis. D.C.Health and Company, 1991, p. 550.*

* cited by examiner

*Primary Examiner*—Randy Gulakowski
*Assistant Examiner*—M. Kornakov
(74) *Attorney, Agent, or Firm*—Bingham McCutchen LLP; Sandra P. Thompson

(57) ABSTRACT

A method of rinsing an electronic substrate recognizes that adding a buffer to a rinsing fluid eliminates fluctuations in the amount of residues on an electronic substrate, and a buffered rinsing fluid is prepared by (a) providing water from a water source; (b) deionizing the water to produce deionized water; (c) adding a buffer to the deionized water at a concentration effective to eliminate fluctuations in the amount of residues on the electronic substrate. The electronic substrate is rinsed with the buffered rinsing fluid.

13 Claims, 2 Drawing Sheets

LOW SPECIES BUFFERED RINSING FLUIDS AND METHOD

FIELD OF THE INVENTION

The field of the invention is electronic structure intermediates and methods for manufacturing same, especially including rinsing intermediates and procedures employed during such manufacture.

BACKGROUND OF THE INVENTION

Modern electronic substrates are generally fabricated in a multi-step process. For example, the manufacture of a printed circuit board (PCB) typically includes plating of a dielectric with at least one metal layer, photolithographic processing of the metal layer, applying flux to the processed layer, and soldering of the processed board. The PCB may hereby be a rigid structure as typically found in common electronic devices such as a radio, a TV set, or a telephone, but may also be a flexible structure including polyamide and polyimide films, as frequently utilized in packaging applications in the microelectronics industry. Most of these steps generally require specific chemicals and particular environments, and some materials employed in one step may interfere with chemicals or procedures utilized in another step. Therefore it is common to clean the electronic substrate during many stages in the processing to avoid unwanted carry-over of material from one step to the next. For example, in a typical process of manufacturing a printed circuit board, soldering fluxes are first applied to the circuit board to ensure firm and uniform bonding of the solder. Although useful to enhance binding of the solder, fluxes usually need to be removed with a cleaning agent from the board after application of the solder to prevent decreased board resistance and potential malfunction of the circuit board.

A wide variety of cleaning agents is known in the art to remove unwanted material. Generally, cleaning agents for electronic substrates contain additives such as surfactants, alcohol derivatives, alkanolamines, or ionic- and/or non-ionic detergents, etc., to assist in the solubilizing of unwanted materials or contaminants. Additives typically speed up or considerably improve the cleaning process, however, in most cases care must be taken to remove the additives after the cleaning step, or they will contribute to undesirable build-up of residual cleaning agent, which may interfere with downstream process steps.

It is known to use microfiltered ultrapure water to flush PCBs and other electronic substrates in order to prevent undesirable build-up of ingredients from the rinsing fluid. Ultrapure water is especially advantageous, because it can be removed by various methods without leaving concentrated material on the surface of the electronic substrate. However, it is commonly found that ultrapure water is a poor rinsing agent with relatively limited capacity to remove residues from an electronic substrate, leading to fluctuations in the amount of residues depending on the intensity of the rinsing step. This is especially apparent when the electronic substrate is manually rinsed.

It is also known to rinse electronic substrates with substantially pure tap water supplied from a public utility source. In general, tap water exhibits better rinsing performance than ultrapure water and is therefore a common rinsing agent in the production of many electronic substrates, including PCBs. Moreover, tap water is inexpensive, and environmentally friendly. When rinsing with tap water is performed on electronic substrates with micro-sized structures (i.e. structures of smaller than 1 mm), micro- or ultrafiltration is frequently employed to remove particulate matter that might impair the structure or function of the electronic substrate.

However, the use of tap water has a severe disadvantage. Tap water, although substantially pure, still contains a multitude of dissolved ionic species and organic contaminants. When evaporated or not completely removed, the dissolved matter in the tap water tends to form residues by precipitation or crystallization. This may pose additional problems, since the chemical composition of tap water is frequently not consistent over time and location. Consequently, the use of tap water is accompanied by fluctuations in the amount of residues left on an electronic substrate.

Although various methods of rinsing electronic substrates using substantially pure water are known in the art, all or almost all of them suffer from fluctuations in the amount of residues left on an electronic substrate. Thus, there is still a need to provide methods and compositions to eliminate fluctuations in the amount of residues on an electronic substrate.

SUMMARY OF THE INVENTION

The present invention is directed to a method of rinsing an electronic substrate. In one step, it is recognized that fluctuations in the amount of residues on an electronic substrate are eliminated by adding a buffer to a rinsing fluid. In another step, a buffered rinsing fluid is prepared by (a) providing water from a water source; (b) deionizing the water to produce deionized water; (c) adding a buffer to the deionized water at a concentration effective to eliminate fluctuations in the amount of residues on the electronic substrate. In a further step the electronic substrate is rinsed with the buffered rinsing fluid.

In one preferred embodiment the source water is substantially pure tap water, wherein the tap water is supplied from a public utility facility, deionized on site by reverse osmosis, and sodium bicarbonate is added at a concentration of 400–500 ppm as a buffer to obtain a pH of approximately 8.0.

In another preferred embodiment, the electronic substrate is a flexible polyimide PCB, and more preferably an unfinished PCB after a photolithographic developing step.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
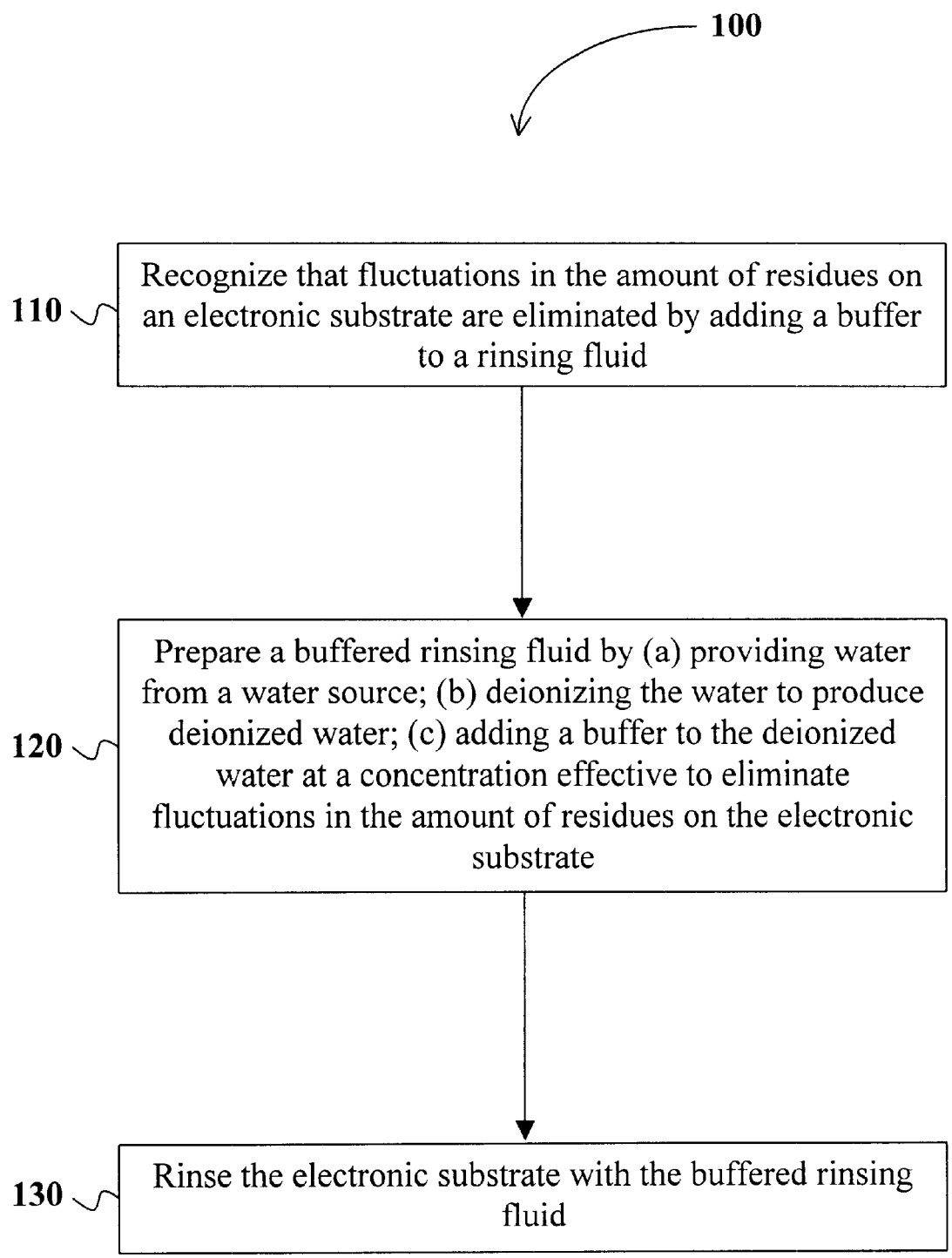
FIG. 1 is a process flow of rinsing an electronic substrate according to the inventive subject matter.

As used herein, the term "rinsing" refers to a process, in which a particulate matter; a fluid, or a dissolvable substance is at least partially removed from a substrate by dissolving in, and/or displacing with a solvent or a solvent mixture, whereby the solvent or solvent mixture may be in a gaseous, liquid, or solid phase. Especially contemplated methods of dissolving or displacing include immersion of the substrate in a solvent, spraying, and roll coating of a solvent on the substrate.

As also used herein, the term "electronic substrate" generally refers to a composite structure, having at least one dielectric or semiconductor portion, and at least one electrically conductive portion (i.e. having a resistance of less than about 1 kΩ). For example, electronic circuit assemblies, such as printed circuit boards, printed wiring boards, integrated circuits, and interconnect structures are considered an electronic substrate under the scope of this definition. Especially contemplated electronic substrates include flexible PCBs manufactured from polyimides or polyamides.

As further used herein, the term "deionizing" refers to a process of removing ions from a solvent, wherein removing means that the concentration of any given ions is reduced from its original level to a level of equal or less than 1 ppm. Especially contemplated processes include reverse osmosis, ultrafiltration, and distillation. When water is deionized to an extent that no ionic species is present at a concentration above a trace level (i.e., in amounts of more than about 50 $\mu g/l$, or 50 ppb), then the water will be referred to as "ultrapure" water under the scope of this definition.

The term "substantially pure water" refers to water from a public utility source to which no additional organic or inorganic compounds have been added. Such water typically falls within the "National Primary Drinking Water Regulations" and "National Secondary Drinking Water Regulations" standards, which allow a plurality of dissolved ionic species ranging from sub-zero milligram/liter amounts (e.g., silver 0.1 mg/l) to triple-digit milligram/liter amounts (e.g., chloride 250 mg/l). Contemplated substantially pure water may typically have between 15–40 different species of dissolved ions in various concentrations, and in some cases between 40 and 60 or more different species of dissolved ions. For the purpose of this definition, ionic species present in traces (i.e., in amounts of less than about 50 $\mu g/l$) are disregarded.

The term "low species fluid" generally refers to a deionized fluid to which a low number of dissolved ionic species has been added, wherein the low number generally does not exceed six, and wherein the concentration of each of the dissolved ionic species is no less than 50 ppm, respectively. It is especially contemplated herein, that the fluid is deionized water with no more than four ionic dissolved ionic species present at a concentration of at least 100 ppm, respectively. For example, ultrapure water in which sodium bicarbonate is dissolved at a concentration of 200 ppm would be considered a low species fluid under the scope of this definition. However, substantially pure tap water in which sodium bicarbonate is dissolved at a concentration of 200 ppm would not be considered a low species fluid, because tap water does not qualify as a deionized fluid.

As still further used herein, the term "buffer" refers to a compound or compound mixture, that maintains the pH of a solvent constant by either absorbing $H^+$-ions that are added to, or generated in the solvent, or by releasing $H^+$-ions when a base is added to, or generated in the solvent.

The term "residue" as used herein refers to any material used in the multi-step manufacture of an electronic substrate, which is (a) carried over from a previous step and (b) has no immediate function, or has detrimental effect on structure and/or performance of the electronic substrate. For example, drilling of a circuit board with a drill to create through holes frequently generates microscopic fragments that remain on the board. In subsequent steps, these fragments are considered a residue under the scope of this definition. In another example, photolithographic developer that is not removed after developing a masked and exposed circuit board is also considered to be a residue in following processing steps. In still another example, salts, including chlorides, carbonates, or phosphates deposited after a washing step with non-deionized water are also considered a residue under the scope of this definition.

An exemplary method of rinsing an electronic substrate is shown in FIG. 1. In general, a method 100 of rinsing an electronic substrate comprises the following steps: In a first step 110 it is recognized that fluctuations in the amount of residues on an electronic substrate are eliminated by adding a buffer to a rinsing fluid. In a further step 120 a low species buffered rinsing fluid is prepared by (a) providing water from a water source; (b) deionizing the water to produce deionized water; (c) adding a buffer to the deionized water at a concentration effective to eliminate fluctuations in the amount of residues on the electronic substrate, and in a further step 130 the electronic substrate is rinsed with the low species buffered rinsing fluid.

In a preferred embodiment, the electronic substrate is a printed circuit board after an etching step in a photolithographic process. In a first step it is recognized that adding a buffer to a rinsing fluid to create a low species buffered rinsing fluid eliminates fluctuations in the amount of residues on an electronic substrate, wherein the residue comprises an etchant. In a further step a low species buffered rinsing fluid is prepared wherein tap water is provided from a public utility facility. The tap water is subsequently deionized in a reverse osmosis process at the point of use, and sodium bicarbonate is added as a buffer to the deionized water a concentration of 450 ppm to obtain a rinsing fluid at a pH of 8.0. In a further step, the printed circuit board is immersed for 1 min in a tank containing the low species buffered rinsing fluid, and the printed circuit board is gently agitated.

In alternative embodiments, the electronic substrate need not be limited to a printed circuit board after a developing step in a photolithographic process, but may also include printed circuit boards in various other processing steps. Appropriate processing steps include cutting or otherwise shaping a dielectric substrate from a bulk dielectric, drilling, punching or lasing through holes in the shaped dielectric, metallization (e.g., mechanical, electroless, or electrolytic plating) of the shaped dielectric, and application or removal of a photoresist or soldering flux. It is also contemplated that alternative electronic substrates need not necessarily be restricted to circuit boards, but may also include electronic wiring boards, substrates comprising an electronic interconnect structure, and semiconductor devices such as integrated circuits, etc. It should further be appreciated that many more non-electronic articles may also benefit from the inventive subject matter presented herein, including articles with metal, glass or polymer surfaces exposed to a rinsing step.

With respect to the residue, various materials other than an etchant are contemplated, including copper (e.g., copper salts, $Al_2Cu$-precipitates, metallic copper), photoresist, detergents, mineral salts of organic or inorganic acids, particulate material, and so forth.

Although in preferred embodiment tap water is deionized by reverse osmosis, it should be appreciated that the process of deionizing is not especially critical to the inventive concept presented herein. Thus, various methods other than reverse osmosis are also contemplated, including distillation, and ultrafiltration. Moreover, the deionized water may also further be purified to produce ultrapure water.

It is further contemplated that various solvents other than water may be employed, including water miscible and water immiscible solvents. Water miscible solvents may include DMF (Dimethylformamide), DMSO (Dimethylsulfoxide), low-molecular weight PEG (polyethylene glycol), etc. Of course, any reasonable mixture of water with a water-miscible solvent is also appropriate. Water immiscible solvents include hexane, cyclopentanone, benzene, and so forth.

In still other aspects of contemplated embodiments, various buffers other than sodium bicarbonate may be employed to produce the low species buffered rinsing fluid. Contemplated buffers include compounds or compound mixtures comprising an amphoteric buffer, or an acid and the corresponding salt of the acid. For example, amphoteric buffers include TRIS (Tris-(hydroxymethyl)aminomethane), HEPES (N-2-Hydroxyethylpiperazine-N'-2-ethanesulfonic acid), MES (2-(N-morpholino)-ethanesulfonic acid), etc. Amphoteric buffers are especially contemplated because they generate buffer capacity while adding only a single ionic species. It should be noted however, that the buffering range of amphoteric buffers is limited to the chemical nature of the amphoteric molecule. Buffers made from an acid and a corresponding salt of the acid offer a broader spectrum with respect to the buffering range. For example, buffers may be formulated in a pH range of 1–3 using HCl and KCl. Other buffers in a slightly acidic to moderate alkaline pH range may be formulated by employing $H_3PO_4$ and $KH_2PO_4$, $KH_2PO_4$ and $Na_2HPO_4$, or $Na_2HPO_4$ and $PO_4^{3-}$. An especially contemplated pair of an acid and the corresponding salt of the acid includes carbonic acid and alkali metal salts of carbonic acid such as potassium bicarbonate. Other especially contemplated pairs include phosphoric acid, dihydrophosphoric acid, hydrophosphoric acid, and alkali- and alkaline earth metal salts of the phosphoric acids, and so forth. It should further be appreciated that any reasonable combination of contemplated buffers may be utilized in a low species rinsing fluid so long as the number of ionic species does not exceed six. Contemplated combinations may advantageously lead to an extended range of buffering capacity, and appropriate buffers may therefore have two, four, or five different ionic species. With respect to the concentration of the various ionic species it should be recognized that approximately equimolar concentrations of the acid and the corresponding salt are preferred.

With respect to the concentration of the buffer, various concentrations other than 450 ppm are contemplated, including concentrations of between approximately 450 ppm and 10 ppm, or less, but also concentrations between 450 ppm and 1000 ppm, and more. Concentrations lower than 450 ppm may be advantageous when the PCB is relatively clean, or when residues or contaminations do not have acidic or alkaline character. However, it should be noted that as the concentration of the buffer decreases, the rinsing performance may also decrease. Concentrations of buffers higher than 450 ppm may be especially beneficial, when the rinsing fluid is also used as a cleaning fluid. Thus, contemplated concentrations of appropriate buffers may embrace a relatively wide range of between about 100 ppm and 1000 ppm, and more preferably between 400 and 500 ppm.

Although in the preferred embodiment the pH of the low species buffered rinsing fluid is 8.0, it is generally contemplated that the pH of the low species buffered rinsing fluid lies within the alkaline range of between 07–14, and more preferably within the range of 7.5 and 9.0. The pH range of 7.5 and 9.0 is especially advantageous because neutral to moderately alkaline buffers typically allow inadvertent exposure (e.g., skin) without the immediate risk of bodily injury. However, depending on the nature of the residue or contamination, more alkaline solutions may be preferable. For example, it is known that some developer solutions for a photolithographic process can be effectively removed with relatively strong alkaline solutions. Other contaminants may be more effectively rinsed off with a more acidic rinsing solution. Therefore, if appropriate, acidic conditions are also contemplated, whereby such acidic conditions may generally lie within the range of pH 1.0 to pH 7.0. It should be noted, however, that extreme acidic or alkaline conditions are generally not preferred because such conditions may disadvantageously lead to hydrolysis or other damage of the PCB.

The number of ionic species utilized in the low species buffered rinsing fluid may vary between one and no more than six, depending on the particular application and substrate. Simple rinsing applications may include only two or three ionic species in the rinsing fluid, for example $Na^+$ and $HCO_3^-$, or $Na^+$, $H_2PO_4^-$, and $HPO_4^{2-}$, while more complex rinsing fluids may include as many as five or six ionic species which may advantageously broaden the buffering range. Moreover, the use of more than one single ionic species may help to render the rinsing fluid more compatible to a particular residue, contamination, or PCB.

In further alternative embodiments, the step of rinsing need not be limited to immersing the electronic substrate for 1 min in a tank containing the low species buffered rinsing fluid with gentle agitation, but may include various alternative rinsing methods. Appropriate methods may include spray rinsing, flushing, dipping, or scrubbing the electronic substrate with the rinsing fluid. Similarly, the duration of the rinsing step is not restricted to 1 min, but may vary considerably depending on the method of rinsing. For example, a high-pressure spray rinsing step may require only a few seconds to obtain a particular result, whereas simple immersion without further agitation or application of ultrasound may take several minutes to obtain the same result.

Figure 2:
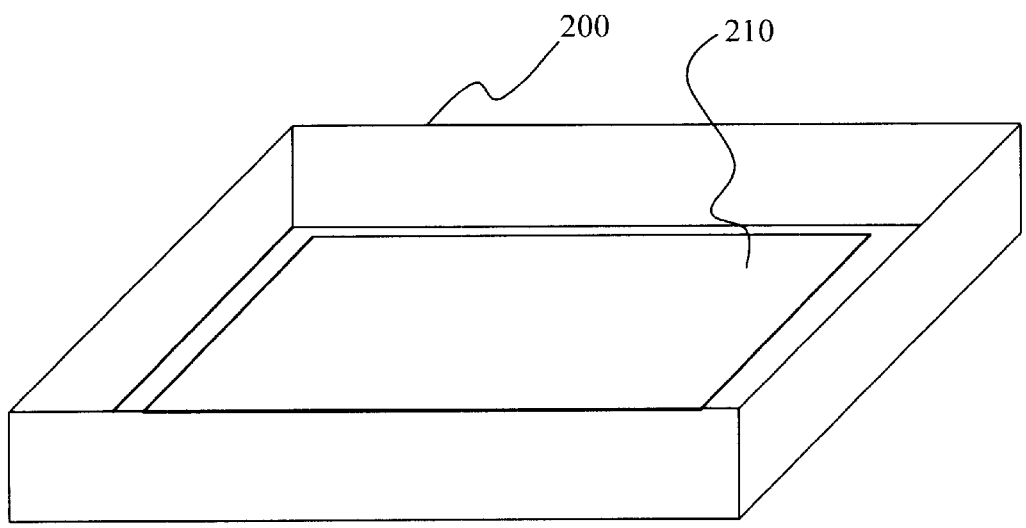
FIG. 2 is a perspective view of an intermediate according to the inventive subject matter.

Turning now to FIG. 2, an intermediate 210 is situated in a bath 200. When utilizing a low species buffered rinsing fluid to rinse a printed circuit board after an etching step, the intermediate 210 comprises the printed circuit board having residues from the etching step and a solution of deionized water and buffer contacting the printed circuit board in a bath. It is preferred that the buffer in the intermediate is sodium bicarbonate at a concentration of between 450 ppm, and has a pH of 8.0. Bath 200 is a shallow stainless steel pan.

In alternative embodiments, solvent, buffer, concentration of the buffer, and pH of the rinsing fluid may vary, whereby the same considerations apply for like components as discussed in the preparation of the rinsing fluid (vide supra). With respect to the bath, it should be recognized that many baths other than a shallow stainless steel pan are also appropriate, and that form or size of alternative baths are not limiting to the inventive subject matter. For example alternative baths may be an open or closed sink, or a small tank, so long as the printed circuit board can contact the low species buffered rinsing fluid. Although immersion is of the PCB is preferred, various alternative methods of contacting the printed circuit board with the low species buffered rinsing fluid are also contemplated and include spraying, or flushing the board with the rinsing fluid. Spraying or flushing may be especially advantageous when the rinsing step is performed on-line with equipment that is suited for such alternative methods.

Thus, specific embodiments and applications of low species buffered rinsing fluids have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises", and "comprising", should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of rinsing an electronic substrate, consisting essentially of:

preparing a low species buffered rinsing fluid by (a) providing water from a water source; (b) deionizing the water to produce deionized water; (c) adding a buffer to the deionized water at a concentration effective to dissolve or displace a residue on the electronic substrate, and at a concentration effective to eliminate deposition of residues on the electronic substrate, wherein the low species buffered rinsing solution consists essentially of a buffer and deionized water at a concentration effective to dissolve or displace a residue on the electronic substrate, and at a concentration effective to eliminate deposition of residues on the electronic substrate wherein the buffer consists essentially of sodium bicarbonate and/or potassium bicarbonate and wherein the concentration of the buffer in the rinsing solution is between 10 ppm and 450 ppm; and rinsing the electronic substrate with the low species buffered rinsing fluid.

2. The method of claim 1 wherein the residue comprises an etchant.

3. The method of claim 1 wherein the residue comprises copper.

4. The method of claim 1 wherein the residue comprises particulate material.

5. The method of claim 1 wherein the electronic substrate comprises an electronic interconnect structure.

6. The method of claim 1 wherein the electronic substrate comprises an integrated circuit.

7. The method of claim 1 wherein the electronic substrate comprises a printed circuit board.

8. The method of claim 1 wherein the pH of the low species buffered fluid is between 7–14.

9. The method of claim 1 wherein the pH of the low species buffered fluid is between 7.5–9.0.

10. The method of claim 1 wherein the concentration of the buffer is between 10 and 500.

11. The method of claim 1 wherein the concentration of the buffer is between 400 ppm and 500 ppm.

12. The method of claim 1 wherein the rinsing comprises spray rinsing.

13. The method of claim 1 wherein the rinsing comprises immersion rinsing.

* * * * *